US012578660B2

(12) United States Patent
Nishioka et al.

(10) Patent No.: US 12,578,660 B2
(45) Date of Patent: Mar. 17, 2026

(54) IMAGE CAPTURING APPARATUS AND IMAGE CAPTURING METHOD

(71) Applicant: Hitachi High-Tech Corporation, Tokyo (JP)

(72) Inventors: Akira Nishioka, Tokyo (JP); Shuichi Nakagawa, Tokyo (JP); Hideki Sato, Tokyo (JP); Tomotaka Shibazaki, Tokyo (JP); Masaki Mizuochi, Tokyo (JP); Takanori Kato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 132 days.

(21) Appl. No.: 18/659,842

(22) Filed: May 9, 2024

(65) Prior Publication Data

US 2024/0385539 A1 Nov. 21, 2024

(30) Foreign Application Priority Data

May 16, 2023 (JP) ................................. 2023-080687

(51) Int. Cl.
*G03F 7/00* (2006.01)
(52) U.S. Cl.
CPC ...... *G03F 7/70875* (2013.01); *G03F 7/70775* (2013.01); *G03F 7/70833* (2013.01)
(58) Field of Classification Search
CPC ............. G03F 7/70875; G03F 7/70775; G03F 7/70833; G03F 7/70691; G01N 23/2251;
(Continued)

(56) References Cited

U.S. PATENT DOCUMENTS 7,542,263 B2 * 6/2009 Kochersperger ...... H01L 21/682
156/345.52
11,669,021 B2 * 6/2023 Zaal .................... G03F 7/70858
355/406
(Continued)

FOREIGN PATENT DOCUMENTS

JP 2002-118050 A 4/2002
JP 2017-129875 A 7/2017

*Primary Examiner* — Hung V Nguyen
(74) *Attorney, Agent, or Firm* — Foley & Lardner LLP

(57) ABSTRACT
[Object]
To provide an image capturing apparatus and an image capturing method that can accurately capture an image of a sample irrespective of the presence or absence of thermal expansion by the sample.
[Solving Means]
An image capturing apparatus includes a table, a chuck having a back surface secured to the table and a front surface for holding a sample under suction, a temperature sensor that obtains a temperature of the chuck, a column that captures an image of the sample mounted on the chuck, a mirror provided on the table, a laser interferometer that emits laser light onto the mirror and measures a distance to the mirror, and a control unit that calculates an amount of position correction for an image capturing location on the basis of the temperature of the chuck. The control unit calculates a temperature of the table on the basis of the temperature of the chuck, calculates an amount of thermal expansion by the table on the basis of the temperature of the table, calculates an amount of thermal expansion by the sample on the basis of the temperature of the chuck, and calculates the amount of position correction for the image capturing location on the basis of the amount of thermal expansion by the table and the amount of thermal expansion by the sample.

7 Claims, 5 Drawing Sheets

(58) Field of Classification Search
CPC ....... G01N 2223/303; G01N 2223/321; G01N
2223/418; G01B 11/026
See application file for complete search history.

(56)                      References Cited

U.S. PATENT DOCUMENTS 12,217,930 B2 *    2/2025   Van Heumen .......... H01J 37/20
2008/0106707 A1    5/2008   Kobayashi et al.

* cited by examiner

IMAGE CAPTURING APPARATUS AND IMAGE CAPTURING METHOD

CLAIM OF PRIORITY

The present application claims priority from Japanese Patent application serial no. 2023-080687, filed on May 16, 2023, the content of which is hereby incorporated by reference into this application.

TECHNICAL FIELD

The present invention pertains to an image capturing apparatus and an image capturing method.

BACKGROUND ART

In recent years, the degree of integration of semiconductor products is improving more and more, and even higher increases in precision are required of corresponding circuit patterns. For a sample in which a circuit pattern represented by a semiconductor wafer is formed, various kinds of inspection means are used for the objective of quality control and improving yield. For example, a technique such as using a scanning electron microscope to capture an image of a semiconductor wafer and inspecting the circuit pattern from an obtained image is known.

In high-density integration of semiconductors, reducing the line width of a circuit pattern is addressed. To capture this and perform an inspection requires capturing at high magnification and, in conjunction with this, there is a need to narrow down a field-of-view range. To narrow down a field-of-view range that is to be captured requires field-of-view position accuracy that aligns therewith. In other words, in a case where field-of-view position accuracy is poor and position error is greater than the field-of-view range, an image capturing location falls outside of a field-of-view range that was aimed at. Accordingly, in an image capturing apparatus for inspecting a highly integrated circuit, it is important to increase field-of-view position accuracy.

In a scanning electron microscope, image capturing is performed by scanning an electron beam. Therefore, it is possible to change the scanning position of the electron beam with respect to a sample having a fixed position to thereby change the image capturing location. Accordingly, image capturing is performed once, the resulting image is analyzed, deviation between the position that was aimed at and the position that was actually captured is investigated, and capturing after correcting for an amount of position deviation is performed in second image capturing, whereby it becomes possible to increase the position accuracy for the image capturing location.

In contrast, in an image capturing apparatus that is used in a process for manufacturing a semiconductor product, increasing throughput in order to improve productivity is also required. Accordingly, instead of performing image capturing twice in order to capture one location, there is an expectation of saving time and increasing throughput by making do with one instance of image capturing. In addition, even if image capturing is performed twice, when the field-of-view position accuracy is too poor at the first time of image capturing, it ceases to be possible to find where on a highly-integrated circuit pattern has been captured, and it ceases to be possible to perform even the second image capturing itself after position correction. Accordingly, in order to not lose sight of the field-of-view position of a captured location, it is important to improve the position accuracy at a preliminary stage in which the first image capturing is performed.

Various physical phenomena are present as causes for why position error for an image capturing location arises, and these are intertwined in a complicated manner. In particular, in a stage for positioning a sample, there are heat generation causes due to heat generated by a motor in a movement mechanism or heat generated by friction, and there is the spread or dissipation of heat due to radiant heat transfer or heat conduction by a solid. In addition, a stage always undergoes changes in a heat transfer state due to the relative distance to a peripheral object changing or a contact location changing in conjunction with movement, whereby the temperature distribution changes and thermal deformation in conjunction therewith arises.

There is Patent Document 1, for example, as an approach for unsnarling such a complex phenomenon to thereby increase the position accuracy for the image capturing location. Patent Document 1 (paragraph [0023], etc.) discloses, in a stage apparatus that uses a mirror and a laser interferometer to perform position measurement, a technique that considers the fact that the shape of the mirror changes according to the temperature and that corrects for a position measurement error due to this to thereby control the stage position.

In addition, Patent Document 2 in paragraph sets forth "it may be that the amount of thermal deformation by the substrate P (an amount of fluctuation for linear expansion), which is caused by the difference in temperature between the alignment process and the liquid immersion exposure process, is determined in advance, an amount of correction for correcting this amount of fluctuation is determined in advance, and the positional relation between the substrate P and the pattern image when the overlay exposure is performed is corrected on the basis of this amount of correction."

PRIOR ART DOCUMENTS

Patent Documents

Patent Document 1: JP-2002-118050-A
Patent Document 2: JP-2017-129875-A

SUMMARY OF THE INVENTION

Problem to be Solved by the Invention

However, when performing position correction for an image capturing location, the techniques in Patent Document 1 and Patent Document 2 consider only thermal expansion by the substrate or the stage apparatus on which a sample is mounted. Therefore, there is a problem in not being able to perform image capturing accurately in a case where there is thermal expansion by the sample itself.

Accordingly, an objective of the present invention is to provide an image capturing apparatus and an image capturing method that can accurately capture an image of a sample irrespective of the presence or absence of thermal expansion by the sample.

Means for Solving the Problem

In order to solve the abovementioned problem, an image capturing apparatus according to the present invention includes, for example, a table, a chuck having a back surface secured to the table and a front surface for holding a sample under suction, a temperature sensor that obtains a temperature of the chuck, a column that captures an image of the sample mounted on the chuck, a mirror provided on the table, a laser interferometer that emits laser light onto the mirror and measures a distance to the mirror, and a control unit that calculates an amount of position correction for an image capturing location on the basis of the temperature of the chuck. The control unit calculates a temperature of the table on the basis of the temperature of the chuck, calculates an amount of thermal expansion by the table on the basis of the temperature of the table, calculates an amount of thermal expansion by the sample on the basis of the temperature of the chuck, and calculates the amount of position correction for the image capturing location on the basis of the amount of thermal expansion by the table and the amount of thermal expansion by the sample.

In addition, an image capturing method according to the present invention is, for example, for capturing an image of a sample mounted on a chuck, the method including a table temperature calculation step for calculating, on the basis of a temperature of the chuck, a temperature of a table to which the chuck is secured, a table thermal expansion amount calculation step for calculating, on the basis of the temperature of the table, an amount of thermal expansion by the table, a sample thermal expansion amount calculation step for calculating, on the basis of the temperature of the chuck, an amount of thermal expansion by the sample, a position correction amount calculation step for calculating an amount of position correction for an image capturing location on the basis of the amount of thermal expansion by the table and the amount of thermal expansion by the sample, and a position correction step for correcting a position of the image capturing location on the basis of the amount of position correction.

Advantage of the Invention

By virtue of the present invention, it is possible to provide an image capturing apparatus and an image capturing method that can accurately capture an image of a sample irrespective of the presence or absence of thermal expansion by the sample.

MODES FOR CARRYING OUT THE INVENTION

With reference to the drawings, description is given below in detail regarding the present invention. Note that the present invention is not limited to the embodiments described below. These embodiments are merely examples, and the present invention can be worked in a mode resulting from carrying out various modifications or improvements on the basis of the knowledge of a person skilled in the art. In addition, in each of the drawings used in the following description, the same reference symbols are assigned to common apparatuses and devices, and the description of apparatuses, devices, and operations that are already described may be omitted.

First Embodiment

Figure 1:
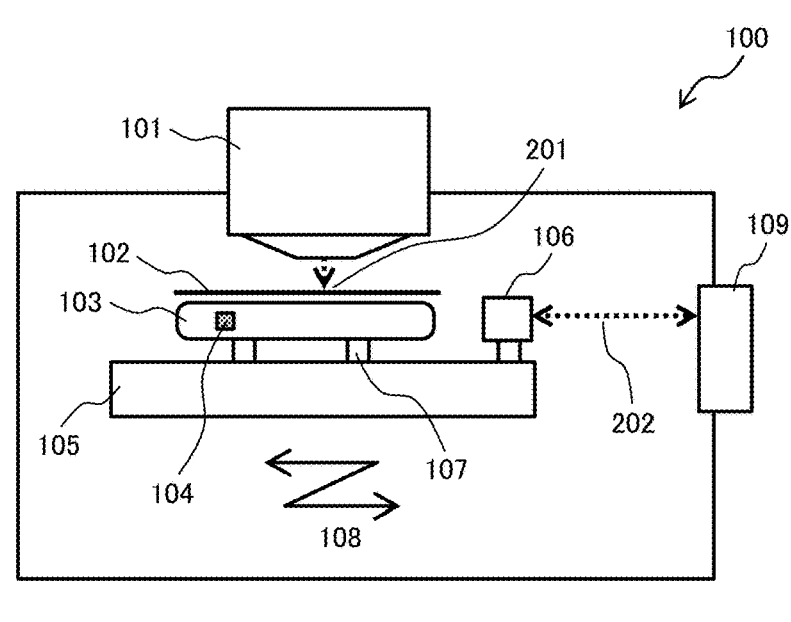
FIG. 1 is a view of a basic configuration of an image capturing apparatus.
Figure 2:
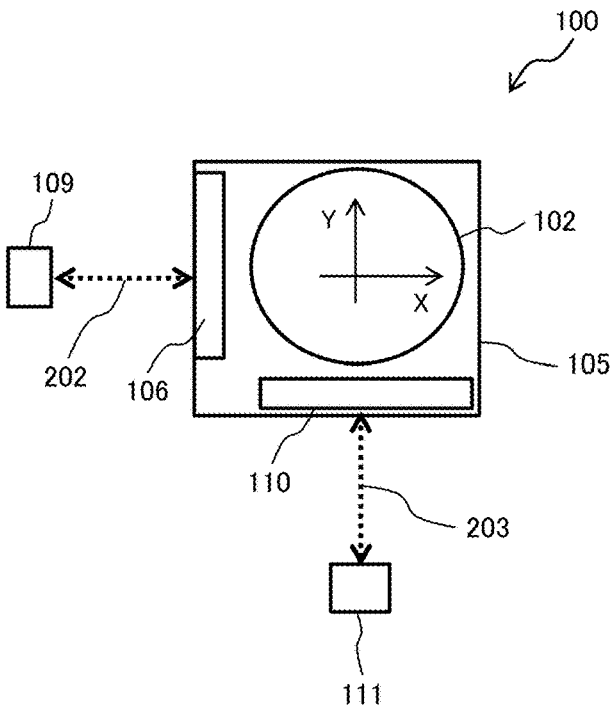
FIG. 2 is a view for describing a coordinate system for the image capturing apparatus.

FIG. 1 illustrates a basic configuration of an image capturing apparatus 100 in the present embodiment. FIG. 1 is a side surface view of the image capturing apparatus 100. In addition, when describing field-of-view position error (position deviation for an image capturing location) for a sample that is to be a target of argument in the present invention, FIG. 2 is for describing a coordinate system for position coordinates. FIG. 2 is a top surface view of the image capturing apparatus 100. Note that FIG. 1 corresponds to a side surface view seen from the Y axis positive direction in the coordinate system illustrated in FIG. 2.

<Approximate Configuration of the Image Capturing Apparatus 100>

As illustrated in FIG. 1, a table 105 is present on an uppermost level of an XY stage 108 (not illustrated), in the image capturing apparatus 100. Note that the XY stage 108 can move in the X-axis direction and the Y-axis direction that are in FIG. 2, and may be able to move in a direction other than these. Further, a chuck 103 is present above the table 105, and the back surface of the chuck 103 is secured to the table 105 through a plurality of chuck support columns 107. Note that it is good for the center of gravity of locations where the plurality of chuck support columns 107 are connected to the chuck 103 to align with the center of the chuck 103. For example, in a case where there are three chuck support columns 107, the connection points thereof are arranged in an equilateral triangle, and the center of gravity of this equilateral triangle is aligned with the center of the chuck 103. Moreover, the position of the center of the chuck is deemed to be the center of the table 105. Note that the center of this table 105 is used to calculate an amount of position correction for an image capturing location 201 that is calculated later, and thus is not a center that is determined from the exterior of the table.

The chuck 103 incorporates a temperature sensor 104, and it is possible to use the temperature sensor 104 to constantly measure the temperature of the chuck 103. Temperature measurement accuracy is particularly important here, and a temperature sensor that uses a platinum resistance thermometer is most suitable. A temperature sensor that uses a typical platinum resistance thermometer uses a platinum wire that is produced such that the electrical resistance becomes $100\Omega$ when at $0°$ C., and the electrical resistance of this platinum wire is measured using a bridge circuit. As a result, it is possible to measure the electrical resistance of the platinum wire without being impacted by the electrical resistance of wiring between the sensor and a measuring instrument. Because the platinum wire is a stable material, change in the electrical resistance arises due to only temperature change, and the relation between temperature and electrical resistance is stable. Accordingly, the correspondence between electrical resistance and temperature is referred to in order to thereby enable highly accurate temperature measurement. In addition, electrical resistance measurement has a characteristic of being robust with respect to electromagnetic noise, in comparison to, inter alia, a method of measuring a voltage that occurs at a sensor.

The image capturing apparatus 100 captures an image of a sample 102 through a column 101, and the sample 102 is mounted on the chuck 103. With an inspection apparatus employed in a process for manufacturing a semiconductor, here, the sample 102 is a semiconductor wafer. In recent years, wafers having a diameter of 300 mm are often used, and the thickness of such wafers is typically less than 1 mm. In an apparatus that handles wafers having a diameter of 300 mm, the diameter of the chuck 103 also becomes close to 300 mm and, in relation to the thickness of the chuck 103, the chuck 103 is set to a structure that is sufficiently thicker than the wafer, and the chuck 103 is made to have high rigidity. In addition, electrostatic force is used to cause the surface of the chuck 103 to hold the wafer under suction by strong force, whereby it becomes possible to align the flatness of the wafer with the flatness of the chuck 103. As a result, even if there is a warp in the thickness direction in the wafer itself, it becomes possible to resolve this warp and ensure a certain flatness.

In an image capturing apparatus that uses an electron microscope, the column 101 corresponds to the electron microscope. An electron beam passes through the center of the column 101, and a position under the center of the column 101 is the image capturing location 201. The column 101 is secured inside the image capturing apparatus 100. When moving the image capturing location 201 for the sample 102 by a large amount, the XY stage 108 moves to thereby cause the mounted sample 102 to move. In addition, in a case of using a scanning electron microscope as the image capturing apparatus 100, it is possible to change, to a certain extent, a position for scanning an electron beam. Accordingly, when moving the image capturing location by only a minute amount, conversely the XY stage 108 is secured, and the scanning position for the electron beam is changed.

When capturing a sample at high magnification, it is necessary to find the position of the image capturing location 201 with high accuracy. Accordingly, for such position measurement, laser interferometers and mirrors that are installed on the table 105 are used. Specifically, an X mirror 106 and a Y mirror 110 are installed on the table 105, as illustrated in FIG. 2. An X-axis laser interferometer 109 is provided so as to face the X mirror 106, and a Y-axis laser interferometer 111 is provided so as to face the Y mirror 110. Note that the X-axis laser interferometer 109 and the Y-axis laser interferometer 111 are secured to the image capturing apparatus 100.

The X-axis laser interferometer 109 causes laser light emitted onto the X mirror 106 to interfere with returning laser light reflected from the X mirror 106 and counts interference fringes, whereby high-accuracy distance measurement is performed in relation to the X-axis direction. As a result, a distance 202, which is between the reflective surface of the X mirror 106 and the X-axis laser interferometer 109 secured to the image capturing apparatus 100, is measured with high accuracy. Similarly, using the Y mirror 110 and the Y-axis laser interferometer 111, a distance 203 between the reflective surface of the Y mirror 110 and the Y-axis laser interferometer 111 is also measured with high accuracy. After the sample 102 is mounted on the chuck 103 and held under suction, the relative distance between the sample 102 and the X mirror 106 as well as the relative distance between the sample 102 and the Y mirror 110 are fixed. Therefore, the relative distance between the X mirror 106 and the coordinates of the image capturing location 201 and the relative distance between the Y mirror 110 and the coordinates of the image capturing location 201 are also fixed. Accordingly, if the positions of the X mirror 106 and the Y mirror 110 are found at high accuracy, the coordinates of the image capturing location 201 on the sample 102 is also found at high accuracy.

As a coordinate system that represents later-described position deviation by the image capturing location 201, the XY coordinate system that is illustrated in FIG. 2 and takes the previously described chuck center as the origin is used. In this coordinate system, for each of the X axis and the Y axis, a direction that goes away from the mirror is employed as a positive direction for a coordinate axis. Note that there is some deviation between the center of the sample and the chuck center, but they are assumed to match here. In addition, the position of the column 101 for capturing the sample is fixed. Therefore, when the stage moves in the positive direction for a coordinate axis, as the location of the sample that is to be captured, a location that has deviated in the negative direction for the coordinate axis is captured.

The image capturing apparatus 100 is provided with a control unit that is not illustrated in FIG. 1 or 2. The control unit obtains measurement results from the X-axis laser interferometer 109 and the Y-axis laser interferometer 111. On the basis of the measurement results from the X-axis laser interferometer 109 and the Y-axis laser interferometer 111, the position of the table 105 is found, and the center of the coordinate system, in other words, the center of the chuck 103 (=the center of the sample 102), is found. The found coordinates (X, Y) in the coordinate system are set to the image capturing location 201. The coordinates of the image capturing location 201 are set to (X, Y) below.

In addition, the control unit obtains the chuck temperature that is obtained by the temperature sensor 104. The control unit uses these to perform a position correction process that is described below. Subsequently, the control unit controls the scanning position of the electron beam within the column 101 or controls a movement mechanism such as a motor that moves the XY stage 108 to thereby correct the image capturing location for the sample 102. In addition, it may be that the control unit obtains an image captured by the column 101 and uses the image to perform the position correction process. Operation by the image capturing apparatus 100 is described in detail below.

Figure 3:
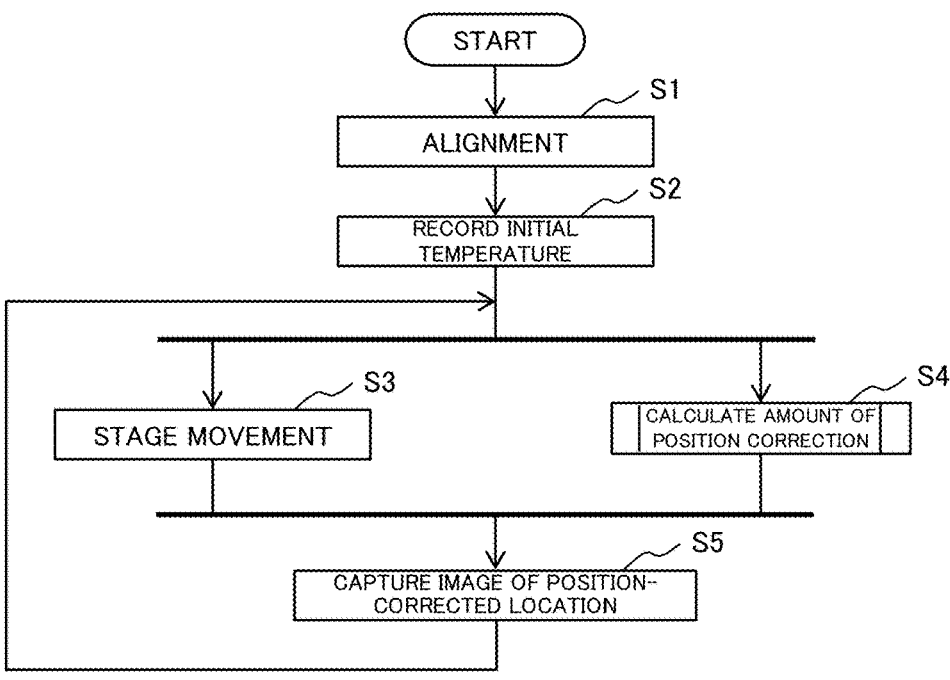
FIG. 3 is a view for a flow of operation by an image capturing apparatus in a first embodiment.

FIG. 3 illustrates a flow of operation by the image capturing apparatus 100. Note that, when the processing flow illustrated in FIG. 3 is started, the sample 102 is mounted on the chuck 103.

<Step S1>

The image capturing apparatus 100 performs alignment in step S1. Alignment is a step for accurately measuring the position of the sample 102 with respect to the XY stage 108, and for finding the position of the sample 102 with respect to the XY stage 108 on the basis of an alignment mark formed on the sample 102. It is assumed that a circuit pattern is shaped on the sample 102 in a step prior to step S1, and an alignment mark that serves as a marker for coordinates has been shaped on the sample 102. The column 101 aligns the stage position such that the design coordinates of the alignment mark, in other words, a position that the alignment mark should properly be at, become an image capturing position, and then captures an image of the location thereof at low magnification and captures an image of the alignment mark. The control unit calculates the coordinates of the captured alignment mark and calculates deviation between the calculated coordinates and the design coordinates of the alignment mark, thereby enabling determination of the position of the sample 102 with respect to the XY stage 108. When capturing of this alignment mark is performed at a plurality of locations, deviation of the center when the sample 102 is mounted to the XY stage 108 as well as an expanded/contracted state that reflects angles of rotation and the temperature of the sample are recognized. In this manner, a step for accurately measuring the relative position of the sample 102 with respect to the XY stage 108 is an alignment step. Note that the chuck 103 and the table 105 are secured to the XY stage 108. Accordingly, the relative position of the sample with respect to the XY stage 108 is accurately measured, whereby it is also possible to find the relative position of the sample 102 with respect to the chuck 103 and the table 105. The relative position that has been found using alignment is used to determine the image capturing location 201, whereby it is possible to accurately capture an image of the sample 102.

For example, in a case where there is a desire to capture an image of a point that is separated by only $(X_1, Y_1)$ from the sample center in relation to the sample 102, it is sufficient to designate the image capturing location 201 as $(X_1, Y_1)$ in the coordinate system that is illustrated in FIG. 2 and has the chuck center as the origin thereof, if the chuck center matches the sample center. In contrast, consideration is given to a case where the chuck center and the sample center deviate by only $(X_2, Y_2)$ when the sample 102 is mounted on the chuck 103. In this case, because the chuck center deviates from the sample center, it is not possible to capture an image of a point that has moved away from the sample center by only $(X_1, Y_1)$, even if the image capturing location 201 is designated as $(X_1, Y_1)$ in the coordinate system that is illustrated in FIG. 2 and has the chuck center as the origin thereof. In such a case, alignment is performed, whereby it is possible to find that there has been deviation of only $(X_2, Y_2)$ caused at the time of mounting the sample 102 to the chuck 103. The image capturing apparatus 100 designates the image capturing location 201 as $(X_1-X_2, Y_1-Y_2)$ in the coordinate system that is illustrated in FIG. 2 and has the chuck center as the origin thereof, whereby it is possible to accurately capture an image of a point that is separated by only $(X_1, Y_1)$ from the sample center. Below, it is assumed that coordinates which have been subjected to correction based on the relative positions of the chuck 103 and the sample 102 found through alignment are used.

<Step S2>

In step S2, the control unit records, as initial temperatures, a chuck temperature that is for a time of alignment and is measured by the temperature sensor 104, and a table temperature that is for the time of alignment and is calculated on the basis of the chuck temperature for the time of alignment by a method similar to that in step S4*b* described below. Note that the chuck temperature is the temperature of the chuck 103, and the table temperature is the temperature of the table 105.

<Step S3>

In step S3, the control unit controls the movement mechanism for moving the XY stage 108 and causes the XY stage 108 to move such that a location on the sample 102 that should be captured, such as an inspection location, becomes the image capturing location 201.

<Step S4>

The image capturing apparatus 100 performs step S4 in parallel with step S3. Note that, in the present embodiment, step S4 is given as being performed in parallel with step S3, but may be performed irrespective of step S3. For example, step S4 may repeatedly performed at a particular cycle.

In step S4, an amount of position correction for the image capturing location 201 is calculated. Specifically, formula (1) and formula (2) are used to calculate an amount $\psi_X$ of position correction for the X-axis direction and an amount $\psi_Y$ of position correction for the Y-axis direction.

[Math. 1]

$$\psi_X = -C_2 \cdot L_X \cdot \Delta T_{table} - C_5 \cdot X \cdot \Delta T_{chuck} \tag{1}$$

[Math. 2]

$$\psi_Y = -C_2 \cdot L_Y \cdot \Delta T_{table} - C_5 \cdot Y \cdot \Delta T_{chuck} \tag{2}$$

Note that Table 1 indicates a list of variables used in equations in the present specification.

TABLE 1

| | |
|---|---|
| $T_{table}$ | Table temperature [° C.] |
| $T_{chuck}$ | Chuck temperature [° C.] |
| $\Delta T_{table}$ | Table temperature change amount [K] |
| $\Delta T_{chuck}$ | Chuck temperature change amount [K] |
| t | Time [s] |
| X | X coordinate of image capturing location [m] |
| Y | Y coordinate of image capturing location [m] |
| $X_f$ | X coordinate of fixed point for sample slippage [m] |
| $Y_f$ | Y coordinate of fixed point for sample slippage [m] |
| $\Psi_X$ | X-direction field-of-view deviation prediction amount [m] |
| $\Psi_Y$ | Y-direction field-of-view deviation prediction amount [m] |
| $\Psi_X^{pre}$ | X-direction field-of-view deviation prior prediction amount [m] |
| $\Psi_Y^{pre}$ | Y-direction field-of-view deviation prior prediction amount [m] |
| $\Delta\Psi_X^{pre}$ | Error in X-direction field-of-view deviation prior prediction amount [m] |
| $\Delta\Psi_Y^{pre}$ | Error in Y-direction field-of-view deviation prior prediction amount [m] |
| $\Psi_X^{real}$ | X-direction field-of-view deviation measurement value [m] |
| $\Psi_Y^{real}$ | Y-direction field-of-view deviation measurement value [m] |
| $X_f^{pre}$ | X coordinate prior value of fixed point for sample slippage [m] |
| $Y_f^{pre}$ | Y coordinate prior value of fixed point for sample slippage [m] |
| m | Stabilization number for fixed point coordinates for sample slippage [—] |
| Q | Amount of heat transfer with respect to chuck [W] |
| K | Heat transfer coefficient for between table and chuck [W/K] |
| C | Average specific heat of chuck material [J/(kg · K)] |
| M | Chuck mass [kg] |
| $L_X$ | Distance from table center to X mirror [m] |
| $L_Y$ | Distance from table center to Y mirror [m] |

TABLE 1-continued

| | |
|---|---|
| $C_1$ | Time constant for chuck [s] |
| $C_2$ | Coefficient of linear expansion for table material [1/K] |
| $C_3$ | Temperature coefficient for X mirror rotation angle [rad/K] |
| $C_4$ | Temperature coefficient for Y mirror rotation angle [rad/K] |
| $C_5$ | Coefficient of linear expansion for sample material [1/K] |
| $C_6$ | Difference in coefficients of linear expansion for chuck and sample [1/K] |
| u | Input data (before smoothing) |
| y | Output data (after smoothing) |
| $\omega$ | Angular frequency [rad/s] |
| $\zeta$ | Damping coefficient (=1/√2) [—] |
| $\tau$ | Time constant for smoothing [s] |
| x | Time derivative of output data |
| $\Delta t$ | Time interval of data [s] |
| N | Time series number for data |

Figure 4:
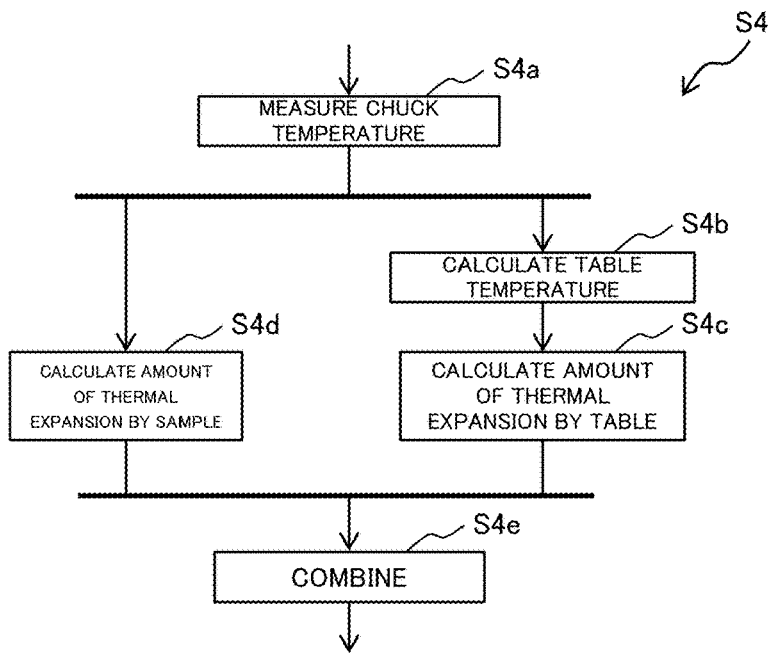
FIG. 4 is a detailed flow chart for step S4 in the first embodiment.

FIG. 4 illustrates a detailed flow of step S4 in the first embodiment. Step S4 in the present embodiment is provided with steps S4a through S4e.

<<Step S4a>>

In step S4a, the temperature sensor 104 measures the chuck temperature.

<<Step S4b>>

In step S4b, the control unit calculates the table temperature on the basis of the chuck temperature. For example, the control unit uses time series data for a chuck temperature $T_{chuck}$ obtained from the temperature sensor 104, to calculate a table temperature $T_{table}$ on the basis of formula (3).

[Math. 3]

$$T_{table} = T_{chuck} + C_1 \cdot \frac{dT_{chuck}}{dt} \qquad (3)$$

<<Step S4c>>

In step S4c, the control unit calculates an amount of thermal expansion by the table 105 to thereby calculate an amount by which the relative distance between the sample center and the mirror changes. Specifically, the amount of movement in the X-axis direction by the X mirror 106 with respect to the sample center is determined by multiplying a distance $L_x$ from the center of the table 105 to the reflective surface of the X mirror 106 by a coefficient $C_2$ of linear expansion of a table material and a table temperature increase amount $\Delta T_{table}$. This is equivalent to determining the first term in formula (1). Similarly, the amount of movement in the Y-axis direction by the Y mirror 110 with respect to the sample center, in other words, the first term in formula (2), is determined. The table temperature increase amount $\Delta T_{table}$ here is the difference between the latest calculated value for the table temperature and an initial (at the time of alignment) calculated value for the table temperature. In addition, the table center is deemed to be the same as the chuck center. This is based on disposing the chuck support columns, which connect the table to the chuck, such that the center of gravity of connection points matches the chuck center. The table center is originally defined as being the same as the chuck center, but even if both have thermally expanded at respective temperatures, it is considered that the centers continue to match after thermal expansion if the center of gravity of the chuck support columns matches the chuck center. By virtue of step S4c, it is possible to find the amount of position deviation by the image capturing location 201 due to the X mirror 106 and the Y mirror 110 moving due to the thermal expansion by the table 105 and the distances 202 and 203 illustrated in FIG.

2 having changed. Note that, when the temperature of the table 105 has increased, the X mirror 106 moves in the X axis negative direction and the Y mirror 110 in the Y axis negative direction, and thus a minus sign is added before the coefficient $C_2$ in formula 1 (1) and formula (2). Note that a metal ceramic composite can be exemplified as the table material, and in this case, the coefficient $C_2$ of linear expansion of the table material is $9.0 \times 10^{-6}$.

<<Step S4d>>

In step S4d, the amount of thermal expansion by the sample 102 is calculated. In other words, in step S4d in the present embodiment, the second term in formula (1) and the second term in formula (2) are determined. In step S4d, the chuck temperature $T_{chuck}$ obtained in step S4a is deemed to be equivalent to the sample temperature, and a temperature difference $\Delta T_{chuck}$ between an initial temperature and a latest temperature for the chuck temperature $T_{chuck}$ is deemed to be the amount of increase in temperature of the sample 102. Because normal thermal expansion occurs isotropically, a rate of increase resulting from dividing an amount that the distance between any two points increases by the original distance therebetween is proportional to the amount of increase in temperature, and a proportional coefficient for this time becomes the coefficient of linear expansion for the material. In addition, a case where thermal contraction occurs due to a decrease in temperature can be handled as negative thermal expansion with respect to a negative increase in temperature, and thus it is also possible to handle thermal contraction as "thermal expansion."

In the present embodiment, a fixed point on the sample 102 at a time of thermal expansion (point on the sample 102 for which a position relative to the chuck 103 does not fluctuate) becomes the center of the sample 102, and it is assumed that radial thermal expansion occurs isotropically from the center of the sample 102. Further, the center of the sample 102 is assumed to match the center of the chuck 103. In this case, in the coordinate system illustrated in FIG. 2, X direction displacement due to thermal expansion by the sample 102 is proportional to the X coordinate of the image capturing location 201, and Y direction displacement is proportional to the Y coordinate of the image capturing location 201. Accordingly, in step S4d, an amount resulting from multiplying the X coordinate of the sample 102 by a coefficient $C_5$ of linear expansion of the sample and the temperature increase amount $\Delta T_{chuck}$ is calculated as the amount of thermal expansion in the X-axis direction by the sample 102, and an amount resulting from multiplying the Y coordinate of the sample 102 by the coefficient $C_5$ of linear expansion of the sample and the temperature increase amount $\Delta T_{chuck}$ is calculated as an amount of thermal expansion in the Y-axis direction by the sample 102. By virtue of step S4*d*, it is possible to find the amount of position deviation for the image capturing location 201 due to thermal expansion by the sample 102. Note that the value of the coefficient $C_5$ of linear expansion of the sample is $3.9 \times 10^{-6}$, for example.

<<Step S4*e*>>

In step S4*e*, the amounts of position deviation calculated in step S4*c* and step S4*d* on the basis of formula (1) and formula (2) are combined. In this manner, the amount of position deviation for the image capturing location 201 due to thermal expansion is calculated as an amount of position correction. An amount $\psi_X$ of position correction for the X-axis direction is described as being positive in a direction that approaches the X mirror, and an amount $\psi_Y$ of position correction for the Y-axis direction is described as being positive in a direction that approaches the Y mirror.

<Step S5>

In step S5 illustrated in FIG. 3, capturing is performed after shifting the image capturing location 201 by only the amount of position correction calculated in step S4. As a result, position correction is performed, and image capturing in a state where position accuracy has been improved becomes possible. In addition, while an elapsed amount of time since the time of alignment is small, the amount of temperature change by the sample 102 or the table 105 is small, and thus it is possible to predict, in advance, that position deviation due to thermal expansion will be small. Therefore, capturing may be performed without position correction. Note that, in a case where there are a plurality of locations on the sample 102 that should be captured, steps S3 through S5 are repeated in proportion to the image capturing locations.

<Description of Formula (3)>

Description is given here regarding the derivation of formula (3). Formula (4) is a result of modeling a heat transfer phenomenon due to heat conduction. With the amount of heat transmitted from the table 105 to the chuck 103 being taken as being positive, it is considered that heat proportional to the difference in temperature between the two is transmitted, and the proportional coefficient is set as K.

[Math. 4]

$$Q = K \cdot (T_{table} - T_{chuck}) \tag{4}$$

Formula (4) holds true even in a case where the table temperature is lower than the chuck temperature and, in this case, the amount of heat transmitted from the table 105 to the chuck 103 becomes negative.

Formula (5) is a relational expression for when the chuck temperature increases due to the amount of heat transmitted from the table 105.

[Math. 5]

$$Q = C \cdot M \cdot \frac{dT_{chuck}}{dt} \tag{5}$$

In practice, heat is transferred to the chuck 103 through other routes, but bold modeling is carried out in order to construct a relational expression that has practical use. Formula (5) is derived from the law of conservation of energy and is a relational expression for when the chuck 103 increases in temperature due to an amount of heat obtained by the chuck 103. In other words, a result of multiplying a chuck temperature time derivative (rate of change over time) by the mass of the chuck 103 and the specific heat thereof matches the amount of heat obtained by the chuck 103. The chuck 103 in reality is not made from one material, and thus the specific heat thereof is not determined simply. In addition, heat obtained by the chuck 103 is also transmitted to the sample that is held under suction by the chuck 103, and thus the mass and specific heat of the sample are also related to this. Accordingly, formula (5) is written with a conceptual meaning.

Formulas (4) and (5) indicate having the same amounts of heat, and the relation in formula (6) is derived.

[Math. 6]

$$K \cdot (T_{table} - T_{chuck}) = C \cdot M \cdot \frac{dT_{chuck}}{dt} \tag{6}$$

As a result, formula (7) is derived, and a conceptual formula for calculating the table temperature is obtained. Formula (4) is a result of modeling an amount of heat that is transmitted from the table 105 to the chuck 103.

[Math. 7]

$$T_{table} = T_{chuck} + \frac{C \cdot M}{K} \cdot \frac{dT_{chuck}}{dt} \tag{7}$$

Formula (3) is derived from formula (7) and is for calculating the table temperature from measurement data for the chuck temperature. In other words, it is indicated that a result of multiplying the chuck temperature time derivative (rate of change over time) by a time constant $C_1$ is added to the chuck temperature, whereby the table temperature is calculated. Note that, as illustrated in formula (7), the time constant $C_1$ is formed by the mass, specific heat, and heat transfer coefficient of the chuck 103, but it is better if the time constant $C_1$ is determined in alignment with actual behavior rather than being calculated from individual physical quantities. The time constant $C_1$ is 2500 seconds, for example. Note that subjecting measurement data for the chuck temperature to a time derivative increases the impact of noise, and the value of such is less likely to stabilize. It is intrinsically desirable that the stage temperature do not change as much as possible in order to perform high-accuracy positioning, and it is presupposed that the chuck temperature and the table temperature, which are set as targets here, only undergo minute changes in temperature. Therefore, there is great difficulty in using a time derivative of chuck temperature measurement data to predict the table temperature with high accuracy. Accordingly, description is given next regarding time derivative stabilizing means.

<<Time Derivative Stabilizing Means>>

In a case where there is time series data, in order to determine a simple time derivative, calculation is possible by dividing the difference with respect to data for one step previous by a time step for this point. However, this calculation is dividing a small amount by a small amount, so that the value thereof changes greatly due to a small error, and it is difficult for a stable value to be obtained. Accordingly, a technique for smoothing measurement data is helpful. Formula (8) is a relational expression for determining an output variable y that results from smoothing an input variable u.

[Math. 8]

$$\frac{1}{\omega^2}\frac{d^2y}{dt^2} + \frac{2\zeta}{\omega}\frac{dy}{dt} + y = u \tag{8}$$

Here, there is representation in the form of a second order differential equation for the variable y. A line of thinking for smoothing is as follows. It is considered that a noise component is estimated to be a high-frequency component in comparison to change over time for a true physical quantity, and when data smoothing is performed by dropping this high-frequency component, the true physical quantity will be extracted. Because formula (8) is a differential equation for the variable on the side that is smoothed, there is a property in that the variable that is smoothed is determined by integrating the input variable. By this integration process being present, a noise component that fluctuates in a short amount of time between positive/negative is offset, and a physical quantity resulting from removing noise is extracted. Formula (8) is expressed by the input variable u and the smoothed output variable y, but at a time of application in the present invention, measurement data for the chuck temperature corresponds to the input variable u, and the output variable y corresponds to the smoothed chuck temperature. The third term on the left side and the first term on the right side in formula (8) are in a relation of equality. Therefore, it is found that the output gain with respect to the input is 1. In other words, when the input data changes slowly, the value unchanged becomes the output data. The differential terms that are the first term and second term on the left side in formula (8) are defined by an angular frequency $\omega$ and a damping coefficient $\zeta$. The angular frequency $\omega$ can be determined from a time constant $\tau$ for smoothing, as in formula (9).

[Math. 9]

$$\omega = \frac{1}{\tau} \tag{9}$$

The meaning of the time constant $\tau$ is that a noise component having a cycle greater than T is removed by the smoothing process. However, smoothed data incurs a time delay with respect to original data, and the delay time becomes approximately the time constant $\tau$. Accordingly, when a large time constant $\tau$ is set, it is possible to remove noise having a large cycle and it is possible to forcefully smooth, but the time delay for smoothed data becomes large. In contrast, when the time constant $\tau$ is set small in order to reduce time delay, weak smoothing is achieved, and fluctuation of the value of the time derivative becomes large. Accordingly, it is necessary to appropriately select the time constant $\tau$ by discerning the true rate of change over time of the given physical quantity.

The damping coefficient $\zeta$ has an action in which the smaller the value thereof is set to, the more that a time delay accompanying smoothing is reduced. In contrast, there is also an action of unfortunately amplifying a noise component that synchronizes with the angular frequency $\omega$. Conversely, when the damping coefficient $\zeta$ is set large, the time delay increases, but noise ceases to be amplified. The smallest $\zeta$ in a range where there is no noise amplification is determined theoretically and is $\zeta = 1/\sqrt{2}(\approx 0.707)$. Accordingly, this value is employed for the damping coefficient $\zeta$.

When solving formula (8), the first-order differential of the output variable is newly defined as a variable x, and this is used to rewrite formula (8) to two simultaneous first-order differential equations (10) and (11) that have unknown variables.

[Math. 10]

$$\frac{dy}{dt} = x \tag{10}$$

[Math. 11]

$$\frac{dx}{dt} + 2\zeta\omega x + \omega^2 y = \omega^2 u \tag{11}$$

In order to apply actual data to these equations, discretizing in formulas (12) through (14) is performed.

[Math. 12]

$$\Delta t = t_n - t_{n-1} \tag{12}$$

[Math. 13]

$$\frac{y_n - y_{n-1}}{\Delta t} = x_n \tag{13}$$

[Math. 14]

$$\frac{x_n - x_{n-1}}{\Delta t} + 2\zeta\omega x_n + \omega^2 y_n = \omega^2 u_n \tag{14}$$

Here, the subscript characters for the variables are a time-series number for the data, with the nth item of data meaning the latest data, and n−1th data meaning the item of data previous to this. Formula (12) indicates a time interval for data, but there is no need for this time interval to be constant, and the time interval may change for each number. When formulas (13) and (14) are expanded and solved, formulas (15) and (16) are obtained.

[Math. 15]

$$\left.\frac{dy}{dt}\right|_n = x_n = \frac{x_{n-1} + \omega^2\Delta t(u_n - y_{n-1})}{1 + 2\zeta\omega\Delta t + \omega^2\Delta t^2} \tag{15}$$

[Math. 16]

$$y_n = y_{n-1} + \Delta t \cdot x_n \tag{16}$$

Formula (15) indicates that the latest output variable x is determined using the latest input variable u and the immediately prior output variables x and y. When the latest x is obtained, the latest output y is obtained using formula (16). Subsequently, when the next input is obtained, the previous latest value becomes the immediately prior value and is combined with the latest input to thereby obtain the latest output. This is repeated, whereby smoothed data with respect to the latest measurement data and a time derivative value of this smoothed data are constantly obtained. In addition, the initial values of the output variables are set as in formulas (17) and (18), whereby it becomes possible to start calculations.

[Math. 17]

$$x_0 = 0 \tag{17}$$

[Math. 18]

$$y_0 = u_0 \tag{18}$$

Using the above techniques, it is possible to determine a stable time derivative from measured temperature data that includes noise, whereby formula (3) can be put to practical use, and it is possible to find at high accuracy the temperature of the table which is not measured. As a result, it becomes possible to calculate an amount of thermal expansion at a practical level of accuracy.

In the present embodiment as described above, it is determined that thermal expansion by the sample and thermal expansion by the table on which mirrors are mounted are the main elements, and means for quantitatively predicting each of these elements is constructed. Moreover, the temperature of the sample is found using a measurement value from the temperature sensor for the chuck on which the sample is mounted, and the temperature of the table is found by performing a calculation in which a process is applied to the measurement value of the temperature sensor for the chuck. When temperatures for two locations are found from measurement data for one location, a degree of freedom for calculating thermal expansion doubles, and a calculation of thermal expansion that has higher accuracy becomes possible. The position deviation of the image capturing location 201 is predicted on the basis of the amounts of thermal expansion by these two points, and position correction is performed for only the predicted amount, whereby it becomes possible to greatly improve the position accuracy of the location for capturing a sample.

Accordingly, by virtue of the present embodiment, it is possible to accurately capture an image of a sample, irrespective of the presence or absence of thermal expansion by the sample. As a result, the position deviation between a location that is aimed at and the location that is actually captured is reduced, and, even if capturing at high magnification is performed, accurate capturing of a location that is desired to be inspected becomes possible, and it becomes possible to perform inspection work at a high throughput.

Second Embodiment

Figure 5:
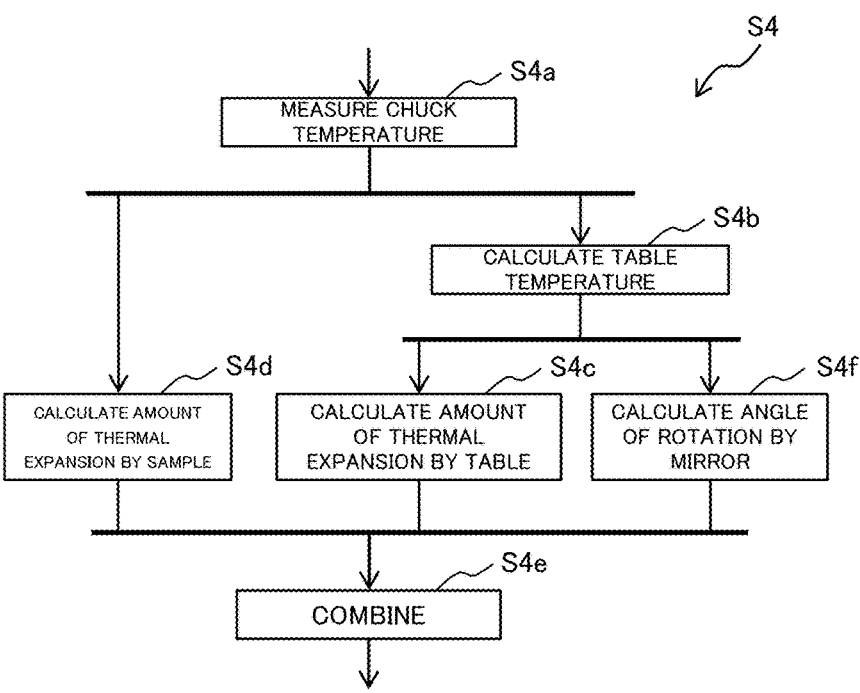
FIG. 5 is a detailed flow chart for step S4 in a second embodiment.

FIG. 5 illustrates a detailed flow of step S4 in a second embodiment. Because most portions are the same as those in the first embodiment, description is only given here for differences.

In step S4 of the present embodiment, a mirror angle of rotation calculation in accordance with step S4f is added, and formula (19) and formula (20) are used to calculate the amount $\psi_X$ of position correction for the X-axis direction and the amount $\psi_Y$ of position correction for the Y-axis direction.

[Math. 19]

$$\psi_X = (-C_2 \cdot L_X + C_3 \cdot Y) \cdot \Delta T_{table} - C_5 \cdot X \cdot \Delta T_{chuck} \tag{19}$$

[Math. 20]

$$\psi_Y = (-C_2 \cdot L_Y + C_4 \cdot X) \cdot \Delta T_{table} - C_5 \cdot Y \cdot \Delta T_{chuck} \tag{20}$$

When the latest table temperature is calculated in step S4b, the amounts of movement by the mirrors 106 and 110 corresponding thereto are calculated, and thus the amount of thermal expansion by the table 105 is calculated in step S4c, but deformation other than isotropic thermal expansion can arise as thermal deformation by the table 105. In other words, in isotropic thermal expansion, the shape of the table 105 after thermal expansion is similar to the shape of the table before expansion. In a case where, hypothetically, the original shape of the table 105 was a square, with isotropic thermal expansion, the square shape would be maintained after expansion. However, the actual table 105 is a structural object that is integral with the XY stage 108, which is present on the lower side thereof. Therefore, components having various material properties are connected and a temperature distribution arises, whereby there is an impact due to an amount of increase in temperature not being uniform, and isotropic thermal expansion does not necessarily occur. Accordingly, even if, hypothetically, the shape of the table 105 seen from above is originally square, the table 105 after thermal deformation could become a trapezoid, a diamond shape, or another shape. In this case, for the mirrors 106 and 110 installed on the table 105, rotational displacement is added to displacement due to the expansion. At a time of such mirror displacement, it is possible to represent an X-direction displacement distribution by displacement resulting from the center of the X mirror 106 moving in the X direction and an angle of rotation resulting from rotation around the center of the X mirror 106. Similarly, for the Y mirror 110, a Y-direction displacement distribution can be represented by displacement resulting from the center of the Y mirror 110 moving in the Y direction and an angle of rotation resulting from rotation around the center of the Y mirror 110.

Thermal expansion is the driving force behind the shape of the table ceasing to be similar to the original shape in conjunction with temperature change, and a change in shape is achieved after the thermal expansion is subjected to various restraints. Accordingly, even with deformation in which mirrors undergo angular change, it is possible to deem that an increase in temperature of the table is the driving force. Accordingly, the angles of rotation of the mirrors are calculated in step S4f on the basis of the table temperature calculated in step S4b.

A coefficient $C_3$ in formula (19) is a temperature coefficient for the angle of rotation of the X mirror 106 and is a proportional coefficient by which the angle of rotation increases in proportion to an increase in the table temperature. The coefficient $C_3$ is $0.2 \times 10^{-6}$, for example. Here, for rotation by the X mirror 106, the mirror center is set as Y=0, and it is assumed that rotation is around this mirror center. Therefore, for an image capturing location having Y=0, the relative distance between the image capturing location and the mirror does not change even if the X mirror 106 rotates. In addition, the angle of rotation here is a minute amount, and it is deemed that the length of an arc due to rotational displacement is the same as the X direction displacement. Accordingly, the coefficient $C_3$ is multiplied by the amount of increase in temperature by the table 105, whereby the angle of rotation by the X mirror 106 (unit: radians) is calculated, and when this is multiplied by a Y coordinate corresponding to a radius, it is possible to calculate the X direction displacement. Work similar to that for $C_3$ is also performed for the coefficient $C_4$ in formula (20). A proportional coefficient by which the Y mirror 110 rotates in proportion to the amount of increase in the table temperature is set to $C_4$, and $C_4$ is multiplied by the amount of increase in the table temperature to obtain the angle of rotation by the Y mirror 110 (unit: radians), and this is multiplied by an X coordinate to thereby obtain Y direction displacement. The coefficient $C_4$ is $-0.3 \times 10^{-6}$, for example.

In other words, in step S4$f$, the Y coordinate of the sample 102 is multiplied by the temperature coefficient $C_3$ for the angle of rotation by the X mirror 106 and the table temperature change amount $\Delta T_{table}$ to thereby determine $C_3 \cdot Y \cdot \Delta T_{table}$ in formula (19). In addition, the X coordinate of the sample 102 is multiplied by the temperature coefficient $C_4$ for the angle of rotation by the Y mirror 110 and the table temperature change amount $\Delta T_{table}$ to thereby determine $C_4 \cdot X \cdot \Delta T_{table}$ in formula (20). Other terms in formula (19) are similar to those in formula (1), and other terms in formula (20) are similar to those in formula (2). In step S4$e$, on the basis of formulas (19) and (20), the position deviation calculated in step S4$c$, step S4$d$, and step S4$f$ are combined to thereby calculate the amount $\psi_X$ of position correction for the X-axis direction and the amount $\psi_Y$ of position correction for the Y-axis direction.

By virtue of the present embodiment, it is possible to accurately capture an image of a sample, even if the table 105 has thermally expanded and the mirrors have rotated.

Third Embodiment

Figure 6:
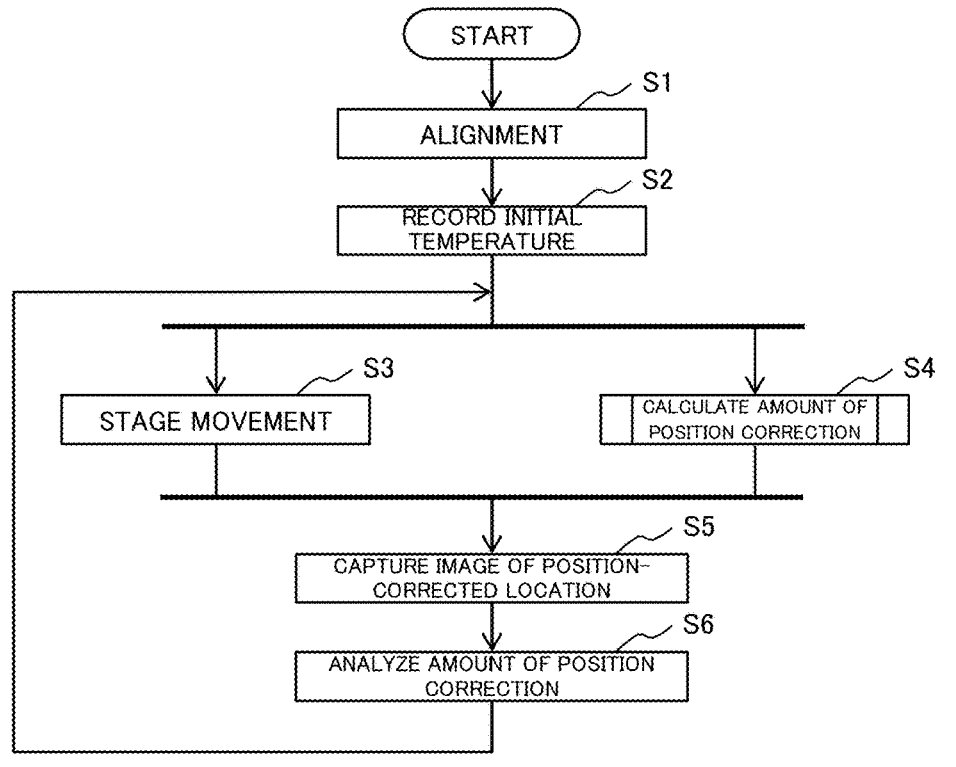
FIG. 6 is a view for a flow of operation by an image capturing apparatus in a third embodiment.
Figure 7:
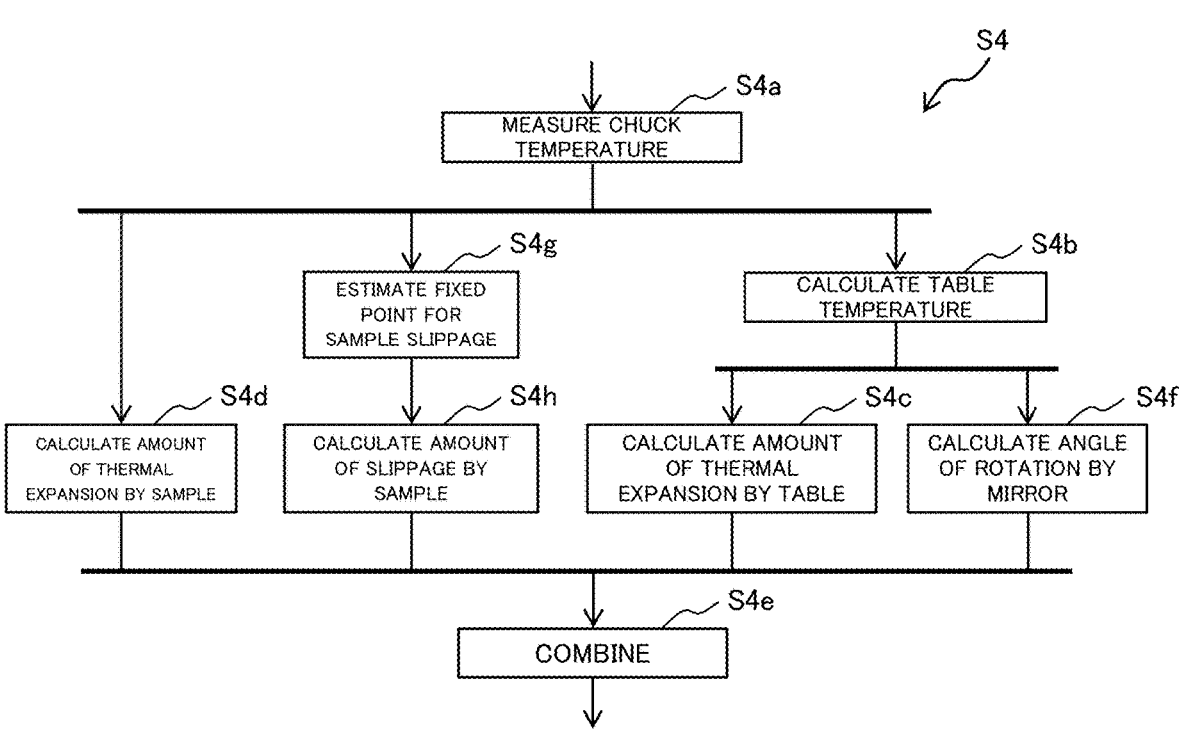
FIG. 7 is a detailed flow chart for step S4 in the third embodiment.
Figure 8:
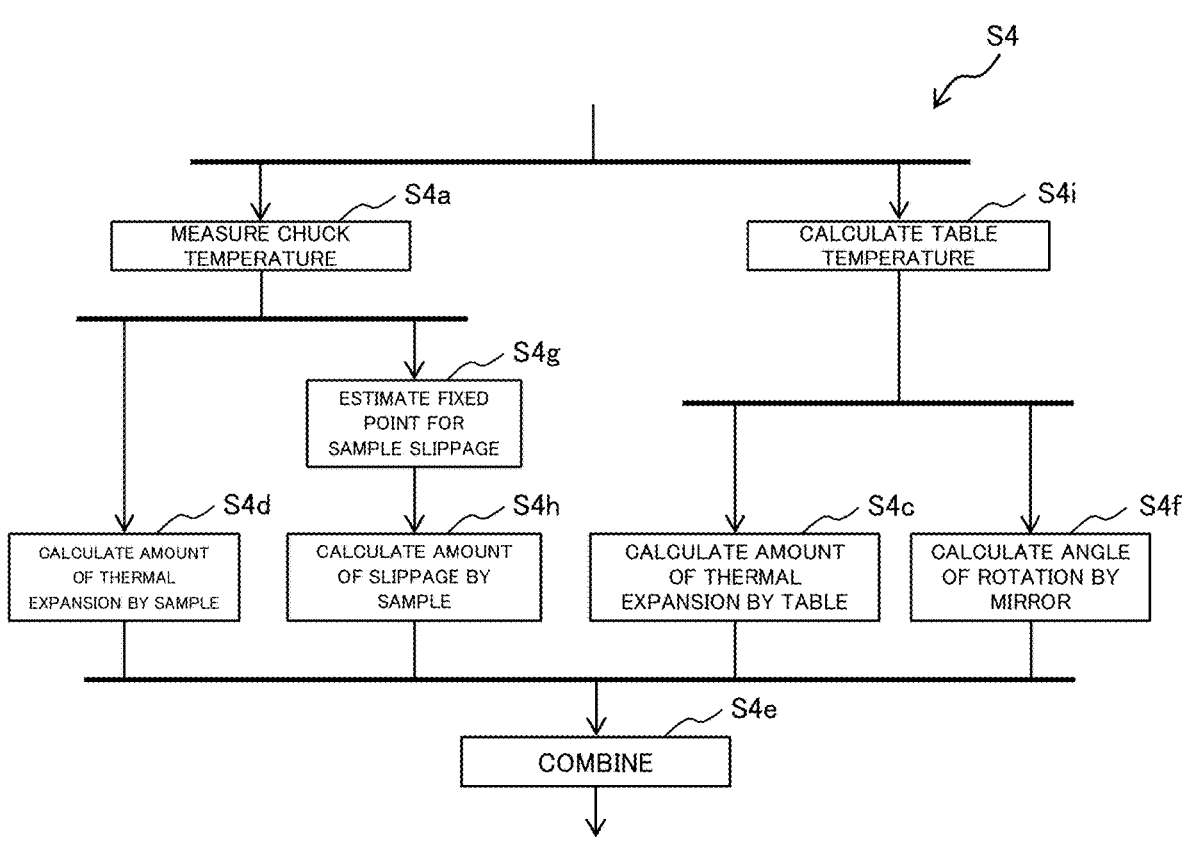
FIG. 8 is a detailed flow chart for step S4 in a fourth embodiment.

FIG. 6 illustrates a flow of operation by the image capturing apparatus 100 in a third embodiment. FIG. 7 illustrates a detailed flow of step S4 in the third embodiment. Description is given here only for differences with respect to the second embodiment.

In the first and second embodiments, it is presupposed that, when the sample temperature increases and thermal expansion occurs, the sample center becomes a fixed point and expansion occurs isotropically. This holds true in a case where the suction force by which the chuck 103 holds the sample 102 works over the entire surface of the chuck 103, and uniform frictional force occurs. In other words, the chuck 103 and the sample 102 are different materials and thus have different coefficients of linear expansion, and have different amounts of thermal expansion even if both maintain the same temperature and then undergo an increase in temperature. In order to fill this gap in amounts of thermal expansion, it is necessary for slippage to arise between the chuck 103 and the sample 102. Frictional force based on the suction force occurs with respect to a slipping action at this time. Accordingly, the slipping action by the sample 102 should occur such that energy consumption due to the frictional force is a minimum. A case where there is minimal relative slippage between the sample 102 and the chuck 103 is where the center of the sample 102 becomes a fixed point and there is radial slippage from there. Accordingly, in a case where the frictional force works uniformly on the chuck 103, the center of the sample 102 should become a fixed point. However, in reality, the suction force between the sample 102 and the chuck 103 does not become uniform, and coefficient of friction is not limited to being constant. Accordingly, it is possible for slippage to arise between the sample 102 and the chuck 103, and a position that differs from the chuck center to become a fixed point. The third embodiment calculates an amount of position deviation in consideration of this.

As illustrated in FIG. 6, the image capturing apparatus 100 in the present embodiment performs step S6 after step S5 in order to estimate the fixed point for sample slippage in step S4. In step S6, the control unit performs image analysis with respect to the image captured in step S5, and the actual amount of position deviation for the image capturing location 201 is analyzed as an actual amount of position correction for the image capturing location 201. This image analysis may be performed on the basis of a circuit pattern or alignment mark that is formed on the sample 102. In addition, the actual amount of position correction for the image capturing location 201 may be analyzed from a plurality of images resulting from capturing a plurality of locations. Note that an analysis result from step S6 is used in the next step S4.

In addition, in step S4 of the present embodiment, step S4$g$ and step S4$h$ are added as illustrated in FIG. 7, and formula (21) and formula (22) are used to calculate the amount $\psi_X$ of position correction for the X-axis direction and the amount $\psi_Y$ of position correction for the Y-axis direction.

[Math. 21]

$$\psi_X = (-C_2 \cdot L_X + C_3 \cdot Y) \cdot \Delta T_{table} - C_5 \cdot X \cdot \Delta T_{chuck} - C_6 \cdot X_f \cdot \Delta T_{chuck} \quad (21)$$

[Math. 22]

$$\psi_Y = (-C_2 \cdot L_Y + C_4 \cdot X) \cdot \Delta T_{table} - C_5 \cdot Y \cdot \Delta T_{chuck} - C_6 \cdot Y_f \cdot \Delta T_{chuck} \quad (22)$$

<Step S4$g$>

In step S4$g$, coordinates ($X_f$, $Y_f$) for the fixed point are estimated. Formula (23) to formula (30) indicate a procedure for determining coordinates of the fixed point for when the sample slips on the chuck. When carrying out this task, formulas (23) and (24) are used first, an amount of position correction for the image capturing location 201 in a case where the coordinates of the fixed point are the sample center is calculated, and this is referred to as a prior prediction value.

[Math. 23]

$$\psi_X^{pre} = (-C_2 \cdot L_X + C_3 \cdot Y) \cdot \Delta T_{table} - C_5 \cdot X \cdot \Delta T_{chuck} \quad (23)$$

[Math. 24]

$$\psi_Y^{pre} = (-C_2 \cdot L_Y + C_4 \cdot X) \cdot \Delta T_{table} - C_5 \cdot Y \cdot \Delta T_{chuck} \quad (24)$$

When the sample 102 is actually captured, it is possible to evaluate the amount of position deviation between an image capturing position envisioned from the stage position and the position that has actually been captured. Accordingly, using formulas (25) and (26), the difference between the prior prediction value for the amount of position correction for the image capturing location 201 and the amount of position correction obtained by actual image capturing is defined as an error for the prior prediction value. Note that amounts $\psi_x^{real}$ and $\psi_y^{real}$ of position correction obtained by actual image capturing use results calculated in a previous step S6. Note that, in a case of calculating the amounts $\psi_x^{real}$ and $\psi_y^{real}$ of position correction from a plurality of images, for example, it may be that amounts $\psi_x^{real}$ and $\psi_y^{real}$ of position correction for each image are calculated, and average values of these are used.

[Math. 25]

$$\Delta \psi_X^{pre} = \psi_X^{pre} - \psi_X^{real} \quad (25)$$

-continued

[Math. 26]

$$\Delta\psi_Y{}^{pre} = \psi_Y{}^{pre} - \psi_Y{}^{real} \tag{26}$$

Upon comparing this with formulas (23) and (24), formulas (27) and (28) for determining coordinates of the fixed point are obtained, and the coordinates of the fixed point obtained in these formulas are first referred to as prior values for the coordinates of the fixed point.

[Math. 27]

$$X_f{}^{pre} = \Delta\psi_X{}^{pre}/(C_6 \cdot \Delta T_{chuck}) \tag{27}$$

[Math. 28]

$$Y_f{}^{pre} = \Delta\psi_Y{}^{pre}/(C_6 \cdot \Delta T_{chuck}) \tag{28}$$

Formulas (27) and (28) are formulas for making determinations by dividing a small value by a small value, and thus a resulting value is likely to be unstable. Accordingly, the values are caused to stabilize by performing operations in formulas (29) and (30).

[Math. 29]

$$X_f = \{X_f{}^{pre} + (m-1)\cdot X_f\}/m \tag{29}$$

[Math. 30]

$$Y_f = \{Y_f{}^{pre} + (m-1)\cdot Y_f\}/m \tag{30}$$

The left sides of formulas (29) and (30) are the coordinates of the fixed point that result from causing stabilization. The latest prior value for a fixed point coordinate comes first on the right side, and the next is a stabilization value for the previous fixed point coordinate. In addition, a stabilization number m is set to a number greater than 1. For example, in a case where m=5, when the latest prior value for the fixed point coordinate is obtained, this is reduced to ⅕ thereof and connected to an update of the fixed point coordinate. By introducing such an operation, it is possible to avoid the coordinates of the fixed point changing suddenly.

Note that, for the coordinates $(X_f, Y_f)$ of the fixed point on the right side in formulas (29) and (30), previous values are used, and the initial values thereof are set to 0.

<Step S4h>

In step S4h, the amount of slippage by the sample is calculated. Specifically, the X coordinate $X_f$ for the fixed point estimated in step S4g is multiplied by a difference $C_6$ between the coefficients of linear expansion of the chuck 103 and the sample 102 and the chuck temperature change amount $\Delta T_{chuck}$ to thereby determine the third term in formula (21). In addition, the Y coordinate $Y_f$ of the fixed point estimated in step S4g is multiplied by the difference Ce between the coefficients of linear expansion of the chuck 103 and the sample 102 and the chuck temperature change amount $\Delta T_{chuck}$ to thereby calculate the third term in formula (22).

Note that the third terms in formulas (21) and (22) relate to coordinates of the fixed point obtained when the sample 102 slips on the chuck 103 due to a difference in amounts of thermal expansion by the sample 102 and the chuck 103. The XY coordinates of this fixed point are written as $X_f$ and $Y_f$.

Therefore, in a case where the fixed point is the sample center, $X_f$ and $Y_f$ become 0, and these terms become 0. In a case where the fixed point differs to the sample center, the fixed point moves proportionally to fixed point coordinates for an amount by which the chuck 103 thermally expands. However, when this expansion occurs, expansion by the sample 102 is also occurring. Therefore, a real amount of movement results from offsetting the amount of thermal expansion by the sample 102 against the amount of thermal expansion by the chuck 103. Accordingly, for the proportional coefficient $C_6$ for an amount of movement proportional to the coordinates of the fixed point, the difference between the coefficient of linear expansion for the chuck material and the coefficient of linear expansion for the sample material is applied. The proportional coefficient $C_6$ becomes $3.2\times10^{-6}$, for example.

<Step S4e>

In step S4e, on the basis of formula (21) and formula (22), the amounts of position deviation calculated in steps S4c, S4d, S4f, and S4h are combined. Note that formulas (31) and (32) are derived when formulas (25) and (26) are used for the first term and the second term in formulas (21) and (22). In step S4e, formulas (31) and (32) may be used.

[Math. 31]

$$\psi_X = \psi_X{}^{pre} - C_6 \cdot X_f \cdot \Delta T_{chuck} \tag{31}$$

[Math. 32]

$$\psi_Y = \psi_Y{}^{pre} - C_6 \cdot Y_f \cdot \Delta T_{chuck} \tag{32}$$

By virtue of the present embodiment, it is possible to accurately capture an image of a sample, even in a case where sample slippage has occurred due to thermal expansion.

Fourth Embodiment

FIG. 4 illustrates a detailed flow of step S4 in a fourth embodiment. Description is given here only for differences with respect to the third embodiment.

In an image capturing apparatus 100 in the present embodiment, the table 105 is provided with a temperature sensor that measures the table temperature. As illustrated in FIG. 9, the table temperature is measured in step S4i and, in steps S4c and S4f, the table temperature measured in step S4i is used to determine the amount of thermal expansion by the table 105 and the angles of rotation by the mirrors.

As in the third embodiment, by virtue of the present embodiment, it becomes possible to predict the amount of position correction for the image capturing location at high accuracy after identifying coordinates of a fixed point obtained when a sample slips on a chuck, and it is possible to capture an image of the sample after increasing accuracy in accordance with position correction.

DESCRIPTION OF REFERENCE SYMBOLS

100: Image capturing apparatus
101: Column
102: Sample
103: Chuck
104: Temperature sensor
105: Table
106: X mirror

107: Chuck support column
108: XY stage
109: X-axis laser interferometer
110: Y mirror
111: Y-axis laser interferometer
201: Image capturing location
202: X-axis stage position measurement distance
203: Y-axis stage position measurement distance

The invention claimed is:

1. An image capturing apparatus comprising:
a table;
a chuck having a back surface secured to the table and a front surface for holding a sample under suction;
a temperature sensor that obtains a temperature of the chuck;
a column that captures an image of the sample mounted on the chuck;
a mirror provided on the table;
a laser interferometer that emits laser light onto the mirror and measures a distance to the mirror; and
a control unit that calculates an amount of position correction for an image capturing location on a basis of the temperature of the chuck,
wherein the control unit
  calculates a temperature of the table on the basis of the temperature of the chuck,
  calculates an amount of thermal expansion by the table on a basis of the temperature of the table,
  calculates an amount of thermal expansion by the sample on the basis of the temperature of the chuck, and
  calculates the amount of position correction for the image capturing location on a basis of the amount of thermal expansion by the table and the amount of thermal expansion by the sample.

2. The image capturing apparatus according to claim 1, wherein the control unit
  calculates an angle of rotation by the mirror on the basis of the temperature of the table, and
  calculates the amount of position correction on a basis of the amount of thermal expansion by the table, the amount of thermal expansion by the sample, and the angle of rotation by the mirror.

3. The image capturing apparatus according to claim 1, wherein the control unit
  analyzes an amount of position correction for the image capturing location from the captured image, estimates, on a basis of the amount of position correction based on analysis and the amount of position correction based on calculation, a fixed point on the sample at which a relative position with respect to the chuck does not fluctuate,
  calculates, on a basis of the fixed point and the temperature of the chuck, an amount of slippage by the sample with respect to the chuck, and
  calculates the amount of position correction on a basis of the amount of thermal expansion by the table, the amount of thermal expansion by the sample, and the amount of slippage by the sample.

4. The image capturing apparatus according to claim 3, wherein the control unit, in the analysis, analyzes the amount of position correction for the image capturing location from a plurality of images resulting from capturing a plurality of locations.

5. The image capturing apparatus according to claim 1, wherein the control unit calculates the temperature of the table on a basis of the temperature of the chuck and a rate of change over time for the temperature of the chuck.

6. The image capturing apparatus according to claim 1, comprising:
a stage that causes the table to move,
wherein the stage corrects, in advance, a position of the image capturing location on a basis of the amount of position correction for the image capturing location.

7. An image capturing method for capturing an image of a sample mounted on a chuck, the method comprising:
a table temperature calculation step for calculating, on a basis of a temperature of the chuck, a temperature of a table to which the chuck is secured;
a table thermal expansion amount calculation step for calculating, on a basis of the temperature of the table, an amount of thermal expansion by the table;
a sample thermal expansion amount calculation step for calculating, on the basis of the temperature of the chuck, an amount of thermal expansion by the sample;
a position correction amount calculation step for calculating an amount of position correction for an image capturing location on a basis of the amount of thermal expansion by the table and the amount of thermal expansion by the sample; and
a position correction step for correcting a position of the image capturing location on a basis of the amount of position correction.

* * * * *